United States Patent
Gunn et al.

(10) Patent No.: US 9,071,234 B2
(45) Date of Patent: Jun. 30, 2015

(54) HIGH-RESOLUTION LINK-PATH DELAY ESTIMATOR AND METHOD FOR ESTIMATING A SIGNAL-PATH DELAY

(71) Applicant: Raytheon Company, Waltham, MA (US)

(72) Inventors: Brian A. Gunn, Goleta, CA (US); Bruce A. Jensen, Goleta, CA (US); Jayoung Nam, Encinitas, CA (US)

(73) Assignee: Raytheon Company, Waltham, MA (US)

( * ) Notice: Subject to any disclaimer, the term of this patent is extended or adjusted under 35 U.S.C. 154(b) by 185 days.

(21) Appl. No.: 13/788,098

(22) Filed: Mar. 7, 2013

(65) Prior Publication Data
US 2014/0253387 A1 Sep. 11, 2014

(51) Int. Cl.
*G01S 13/08* (2006.01)
*G01S 13/74* (2006.01)
(Continued)

(52) U.S. Cl.
CPC ... *H03K 5/14* (2013.01); *G01S 3/50* (2013.01); *G01S 5/12* (2013.01); *G01S 7/021* (2013.01); *G01S 13/82* (2013.01); *H04B 3/462* (2013.01)

(58) Field of Classification Search
CPC ............. H03K 5/13; H03K 5/14; H04B 3/02; H04B 3/46; H04B 3/462; H04B 3/466; H04B 3/48; H04B 3/487; H04B 3/493; G01S 3/02; G01S 3/14; G01S 3/46; G01S 3/50; G01S 5/02; G01S 5/12; G01S 7/02; G01S 7/021; G01S 13/74; G01S 13/82
USPC ................... 342/13, 20, 42–51, 59, 118, 125, 342/134–145, 165, 173–175, 192–197, 342/70–73, 82, 89, 94–97, 350, 385, 386, 342/387, 394; 375/130, 140–153, 211–215
See application file for complete search history.

(56) References Cited

U.S. PATENT DOCUMENTS 2,705,320 A * 3/1955 Palmer .......................... 342/125
3,025,520 A * 3/1962 Werner et al. .................. 342/394
(Continued)

FOREIGN PATENT DOCUMENTS

EP 0616443 A2 9/1994
EP 1891700 B1 2/2013
(Continued)

OTHER PUBLICATIONS

"International Application Serial No. PCT/US2014/021046, International Search Report mailed Jun. 24, 2014", 3 pgs.
(Continued)

*Primary Examiner* — Bernarr Gregory
(74) *Attorney, Agent, or Firm* — Schwegman Lundberg & Woessner, P.A.; Gregory J. Gorrie

(57) ABSTRACT

Embodiments of a high-resolution link-path delay estimator and method are generally described herein. The high-resolution link-path delay estimator may estimate a signal-path delay of a signal path between a master and remote device. The high-resolution link-path delay estimator may phase-shift a transmit signal of alternating symbols by phase-shift values and may sample a loopback signal. A noise-reduced version of the sampled signal output may be correlated with a step function to generate a correlation value for each of the phase-shift values. One of the phase-shift values may be selected to generate a fine-delay estimate which may be added to a coarse delay estimate to determine the signal-path delay. The coarse delay estimate may be an estimate of the signal-path delay to a nearest symbol period of the transmit signal and the fine-delay estimate may be an estimate to within a fraction of the symbol period.

21 Claims, 4 Drawing Sheets

(51) Int. Cl.
*G01S 7/40* (2006.01)
*H03K 5/14* (2014.01)
*G01S 3/50* (2006.01)
*G01S 5/12* (2006.01)
*G01S 7/02* (2006.01)
*G01S 13/82* (2006.01)
*H04B 3/462* (2015.01)
*G01S 13/00* (2006.01)
*G01S 7/00* (2006.01)

(56) References Cited

U.S. PATENT DOCUMENTS

| | | | | |
|---|---|---|---|---|
| 3,097,355 | A * | 7/1963 | Hobrough | 342/95 |
| 3,223,998 | A * | 12/1965 | Hose | 342/125 |
| 3,264,644 | A * | 8/1966 | Jacob | 342/125 |
| 3,377,590 | A * | 4/1968 | Wendell | 342/125 |
| 3,530,467 | A * | 9/1970 | Attwood et al. | 342/125 |
| 4,041,381 | A | 8/1977 | Hwa | |
| 4,562,573 | A | 12/1985 | Murano et al. | |
| 4,620,788 | A * | 11/1986 | Giger | 342/135 |
| 5,528,183 | A | 6/1996 | Maturi et al. | |
| 5,878,032 | A | 3/1999 | Mirek | |
| 6,211,812 | B1 * | 4/2001 | Chiles et al. | 342/145 |
| 6,359,479 | B1 | 3/2002 | Oprescu | |
| 6,477,674 | B1 | 11/2002 | Bates et al. | |
| 6,545,979 | B1 | 4/2003 | Poulin | |
| 6,614,387 | B1 * | 9/2003 | Deadman | 342/125 |
| 6,671,261 | B1 | 12/2003 | Cheung | |
| 6,731,908 | B2 * | 5/2004 | Berliner et al. | 342/47 |
| 6,920,155 | B2 | 7/2005 | Rao | |
| 6,943,595 | B2 | 9/2005 | Sugimoto et al. | |
| 7,139,957 | B2 | 11/2006 | Querbach et al. | |
| 7,199,751 | B2 * | 4/2007 | Mikami et al. | 342/134 |
| 7,248,205 | B2 * | 7/2007 | Uchino | 342/195 |
| 7,259,713 | B1 * | 8/2007 | Matich et al. | 342/145 |
| 7,330,148 | B2 * | 2/2008 | Takenouchi et al. | 342/118 |
| 7,359,408 | B2 | 4/2008 | Kim | |
| 7,525,483 | B2 * | 4/2009 | Eberlein | 342/387 |
| 7,533,285 | B2 | 5/2009 | Naffziger et al. | |
| 7,714,777 | B2 * | 5/2010 | Fukuda | 342/175 |
| 7,765,074 | B2 | 7/2010 | Kim et al. | |
| 2005/0276318 | A1 | 12/2005 | Bokhour | |
| 2007/0109175 | A1 * | 5/2007 | Fukuda | 342/134 |
| 2011/0115669 | A1 | 5/2011 | Milyutin et al. | |
| 2011/0122020 | A1 | 5/2011 | Henkel | |
| 2012/0176271 | A1 | 7/2012 | Dai et al. | |
| 2014/0253200 | A1 | 9/2014 | Gunn | |

FOREIGN PATENT DOCUMENTS

WO WO-2006/108227 A1 10/2006
WO WO-2014/138345 A1 9/2014

OTHER PUBLICATIONS

"International Application Serial No. PCT/US2014/021046, Written Opinion mailed Jun. 24, 2014", 9 pgs.

* cited by examiner

HIGH-RESOLUTION LINK-PATH DELAY ESTIMATOR AND METHOD FOR ESTIMATING A SIGNAL-PATH DELAY

GOVERNMENT RIGHTS

This invention was made with Government support under Contract Number [TBD] awarded by the Department of Defense. The Government has certain rights in this invention.

TECHNICAL FIELD

Embodiments relate to signal-path delay estimation between electronic components. Some embodiments relate to signal-path delay estimation in systems of spatially-distributed sensors. Some embodiments relate to signal-source location including geo-location. Some embodiments relate to determining clock-phase separation of spatially-distributed subsystems. Some embodiments relate to radar-warning receiver (RWR) systems.

BACKGROUND

Electronic communication between distinct components within a system experiences a delay associated with the signal path. Systems may need to compensate for this delay appropriately for the successful implementation of certain functions and/or algorithms. For example, a device receiving reports from one or multiple remote sensors over fiber-optic links may compensate for the signal path delay to correctly record the times at which observations are made. Similarly, a synchronization pulse sent from one device and received by one or multiple other devices may not result in a synchronized system unless the signal path delay is accounted for. Many conventional techniques for signal-path delay estimation do not provide sufficient resolution for some applications, such as systems of spatially-distributed sensors, signal-source location systems and RWR systems.

Thus, there are general needs for systems and methods for high-resolution signal-path delay estimation. There are also general needs for high-resolution signal-path delay estimation suitable for use in systems of spatially-distributed sensors. There are also general needs for high-resolution signal-path delay estimation suitable for signal-source location and RWR systems.

DETAILED DESCRIPTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
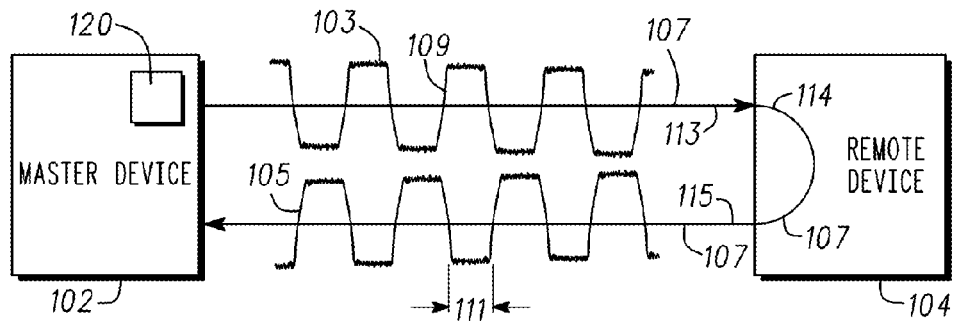
FIG. 1 is a functional diagram illustrating the estimation of a signal-path delay between a master device and a remote device in accordance with some embodiments.

FIG. 1 is a functional diagram illustrating the estimation of a signal-path delay between a master device and a remote device in accordance with some embodiments. Master device 102 and remote device 104 may be configured to communicate electronic signals over signal path 107.

In accordance with embodiments, the master device 102 may include a high-resolution link-path delay estimator 120 which may be configured to estimate the signal-path delay of the signal path 107 between the master device 102 and the remote device 104. In accordance with some embodiments, the high-resolution link-path delay estimator 120 may be configured provide a transmit signal 103 comprising a waveform of alternating symbols. The high-resolution link-path delay estimator 120 may phase-shift the transmit signal 103 by one of a plurality of phase-shift values and may sample a loopback signal 105 to generate a sampled signal output. The loopback signal 105 may be a delayed version of the transmit signal 103 that is returned from the remote device 104 after traveling signal path 107. The high-resolution link-path delay estimator 120 may also correlate a noise-reduced version of the sampled signal output with a step function to generate a correlation value for each of the phase-shift values. The high-resolution link-path delay estimator 120 may also step through at least some of the phase-shift values to select one of the phase-shift values to generate a fine-delay estimate. The fine-delay estimate may be added to a coarse delay estimate to determine the signal-path delay. In these embodiments, the coarse delay estimate may be an estimate of the signal-path delay to a nearest symbol period 111 of the transmit signal 103 and the fine-delay estimate may an estimate of the signal-path delay to within a fraction of the symbol period 111.

In some embodiments, the signal path 107 includes a transmit signal path 113, a receive signal path 115 and a loopback signal path 114. The loopback signal path 114 may be within the remote device 104. The estimate of the signal-path delay of the signal path 107 between the master device 102 and the remote device 104 generated by the high-resolution link-path delay estimator 120 may be the round-trip signal delay between the master device 102 and the remote device 104 and may include signal delays of the transmit signal path 113, the receive signal path 115, and the loopback signal path 114.

In some embodiments, the transmit waveform 103 may be a waveform of alternating symbols or bits such as a square wave as illustrated in FIG. 1 although the scope of the embodiments is not limited in this respect as other waveforms of alternating symbols or bits may also be used. In some embodiments, the master device 102 may include signal generating circuitry to generate the transmit signal 103 and to transmit the transmit signal 103 over the transmit signal path 113.

In some embodiments, the high-resolution link-path delay estimator 120 may sample the loopback signal 105 on rising edges 109 of the phase-shifted transmit signal to generate the sampled signal output, although this is not a requirement.

In some embodiments, the master device 102 and remote device 104 may be configurable to operate in one of either an asynchronous loopback mode or a data-transfer mode. During asynchronous loopback mode, the remote device 104 may be configured to refrain from clocking or re-clocking signals received from the master device 102 and may be configured to receive the transmit signal 103 over the transmit signal path 113 from the master device 102 and return the transmit signal via return path (e.g., signal path 115) without clocking or re-clocking the transmit signal 103. During data transfer mode, the remote device 104 may be configured to communicate data with the master device 102. In these embodiments, asynchronous loopback mode may be entered into as part of a calibration procedure. During data transfer mode, a serial data link may be established between the master device 102 and the remote device 104 during which data clocking or re-clocking may be performed.

In some embodiments, the transmit signal path 113 and the receive signal path 115 are fixed signal paths and may comprise, for example, conventional signal wire, such as copper wire and/or fiber. In these embodiments, the master device 102 and the remote device 104 may be at fixed locations relative to each other and the signal-path delay of the signal path 107 may be estimated to within a fraction of the symbol period 111 of the transmit signal 103. Although the signal path may be fixed, environmental conditions such as temperature may also affect the signal-path delay. In some alternate embodiments, the transmit signal path 113 and/or the receive signal path 115 may comprise wireless links, such as optical, radio-frequency (RF) or microwave links, although the scope of the embodiments is not limited in this respect.

In some embodiments, master device 102 may be configured to communicate with a plurality of remote devices. In these embodiments, the high-resolution link-path delay estimator 120 may estimate a signal-path delay of the signal path between the master device 102 and each remote device. In some of these embodiments, the high-resolution link-path delay estimator 120 may estimate a relative signal-path delay of the signal paths between the master device 102 and the remote devices, rather than an absolute signal-path delay. These embodiments are discussed in more detail below.

Figure 2:
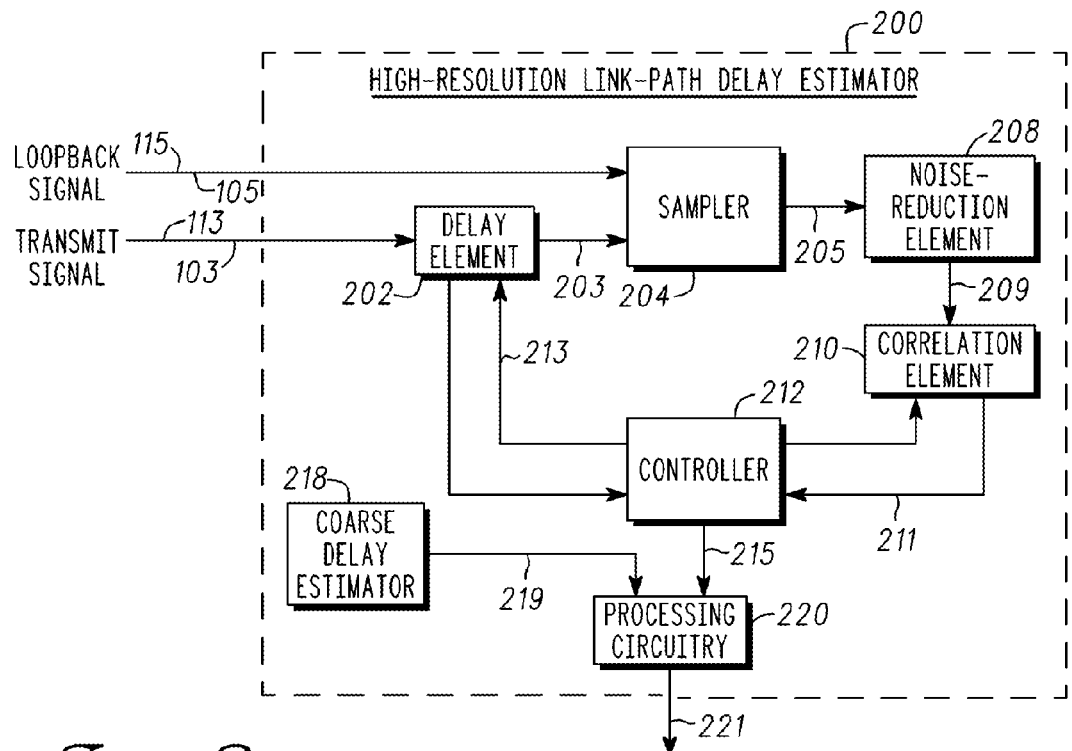
FIG. 2 is a functional block diagram of a high-resolution link-path delay estimator in accordance with some embodiments.

FIG. 2 is a functional block diagram of a high-resolution link-path delay estimator in accordance with some embodiments. High-resolution link-path delay estimator 200 may be suitable for use as high-resolution link-path delay estimator 120 (FIG. 1), although other configurations may also be suitable.

In some embodiments, the high-resolution link-path delay estimator 200 may include a delay element 202 to selectably delay the transmit signal 103 by one of a plurality of delay values. As discussed above, the transmit signal 103 may comprise a waveform of alternating symbols.

The high-resolution link-path delay estimator 200 may also include a sampler 204 to sample the loopback signal 105 to generate a sampled signal output 205. In some embodiments, the sampler 204 may sample the loopback signal 105 on rising edges 109 (FIG. 1) of the delayed transmit signal 203 to generate the sampled signal output 205.

The high-resolution link-path delay estimator 200 may also include a correlation element 210 to correlate an output of the sampler 204 with a step function to generate a correlation value 211 for each of the delay values. In some embodiments that implement noise reduction, the correlation element 210 may correlate a noise-reduced output 209 of the sampler 204 with a step function to generate the correlation value 211 for each of the delay values.

The high-resolution link-path delay estimator 200 may also include a controller 212 to instruct the delay element 202 to delay the transmit signal 103 by a selected one of the delay values and generate a fine-time data output 215 based on the correlation value 211 for the selected delay value. The fine-time data output 215 may be an indicator of the signal-path delay to within a fraction of a symbol period 111 (FIG. 1) of the transmit signal 103.

In some embodiments, the high-resolution link-path delay estimator 200 may also include a coarse delay estimator 218 which produces a coarse delay estimate 219. The coarse delay estimate 219 may be an estimate of the signal-path delay of the signal path 107 with accuracy at to the nearest bit or symbol period 111. In some embodiments, the coarse delay estimator 218 may be separate from the high-resolution link-path delay estimator 200.

In some embodiments, the fraction of the symbol period 111 of the transmit signal 103 to which the high-resolution link-path delay estimator 120 may estimate the signal-path delay of the signal path 107 may be a portion of the symbol period 111 and not necessarily a fractional portion the symbol period 111, although this is not a requirement. However, the high-resolution link-path delay estimator 120 may estimate the signal-path delay of the signal path 107 to a fractional portion of the symbol period 111.

In some embodiments, the transmit signal 103 may comprise a waveform of alternating bits. The fine-time data output 215 may be an indicator of the signal-path delay to within a portion or fractional portion of the bit period of the transmit signal 103.

In some embodiments, the delay element 202 may be a phase-shifter to phase shift either the transmit signal 103 or the loopback signal 105 by one of a plurality of phase-shift values. In these embodiments, the sampler 204 may sample the loopback signal 105 on rising edges 109 of the phase-shifted transmit signal to generate the sampled signal output 205. In these embodiments, the controller 212 may instruct the phase-shifter to phase-shift the transmit signal 103 by one of the phase-shift values and generate a fine-time data output 215 based on the correlation value 211 for one of the phase-shift values.

In accordance with embodiments, the step function used by the correlation element 210 models a noiseless transition (e.g., from low to high or from high to low) of the sampled signal output 205 relative to a phase-shift value allowing the correlation element 210 to generate a correlation value 211 for the particular phase-shift value that is currently implemented by the delay element 202.

In some alternate embodiments, the delay element 202 may be configured to delay the loopback signal 105 instead of the transmit signal 103 by one of the plurality of delay values. In these embodiments, the controller 212 may instruct the delay element 202 to delay the loopback signal 105 by one of the delay values. These alternate embodiments are discussed in more detail below.

In some embodiments, the controller 212 may provide a control signal 213 to the delay element 202 to cause the delay element 202 to shift the transmit signal 103 by a selected one of the delay values. When the delay element 202 comprises a phase-shifter, the controller 212 may be configurable to cause the phase-shifter to shift through at least some of the phase-shift values and select one of the phase-shift values that provides either a highest (e.g., a maximum) correlation value 211 or a correlation value above a threshold to generate the fine-time data output 215 corresponding to the selected phase-shift value.

In these embodiments, the estimate of the signal-path delay of the signal path 107 to within the fraction of the symbol period 111 may be undetectable by the coarse-delay estimator 218, since the coarse delay estimate 219 produced by the coarse-delay estimator 218 is an estimate of the signal-path delay of the signal path 107 with accuracy only to the nearest bit or symbol period 111. In these embodiments, the fraction of the symbol period 111 of the transmit signal 103 to which the signal-path delay may be estimated by the high-resolution link-path delay estimator 120 may be referred to as a fine sync delay or fine-delay estimate. In some embodiments, the symbol period 111 may be a half-clock period as illustrated in FIG. 1.

In some embodiments, the delay value or the phase-shift value which results in a highest correlation value 211 may be the delay or phase shift at which the transmit signal 103 and the loopback signal 105 align to within a fraction of the symbol period 111. This fraction may be based on the resolution of the delay element 202 or the phase shifter and may be based on the number of delay values or phase shift values per symbol period 111. For example, when 256 phase shift values per symbol period 111 are used, the signal-path delay of the signal path 107 may be estimated to within $\frac{1}{256}^{th}$ of the symbol period 111. The attainable resolution may be limited by the resolution of the delay or phase shift element.

In some embodiments, the controller 212 may be configurable to cause the phase shifter to either step or shift through all possible of the phase-shift values (e.g., 256 phase-shift values) based on the resolution of the phase shifter and may select one of the phase-shift values which results in a highest correlation value 211. In other embodiments, the controller 212 may be configurable to cause the phase shifter to step or shift through at least some of the phase-shift values to select one of the phase-shift values resulting in a correlation value 211 above a predetermined threshold (e.g., a local maximum). In some embodiments, each of the phase-shift values may be a fraction of the symbol period 111 of the transmit signal 103 and the plurality of phase-shift values together comprise may up to one symbol period 111 of the transmit signal 103.

In some embodiments, the sampled signal output 205 provided by the sampler 204 may indicate whether the error of the coarse delay estimate 219 of the signal path 107 is positive or negative. As discussed above, the coarse delay estimate 219 may be an estimate of the signal-path delay of the signal path 107 with an accuracy to a nearest symbol period 111 of the transmit signal 103.

In some embodiments, the sampler 204 may provide a low output (e.g., zero) when the loopback signal 105 is low (e.g., zero) while the delayed transmit signal 203 (e.g., the sampled signal) is rising, and may provide a high output (e.g., one) when the loopback signal 105 is high (e.g., one) while the delayed transmit signal 203 (e.g., the sampled signal) is rising. In these embodiments, a low output may indicate that the error of the coarse delay estimate 219 of the signal path 107 is positive (e.g., the coarse delay estimate is too high) and a high output may indicate that the error of the coarse delay estimate 219 of the signal path 107 is negative (e.g., the coarse delay estimate is too low). In some alternate embodiments, instead of sampling the sampled signal while rising (e.g., on the rising edge), the sampled signal may be sampled while falling (e.g., on the falling edge).

In some embodiments, the controller 212 may cause the delay element 202 to either increment or decrement the delay value (or the phase shift value) depending on the output of the sampler 204. For example, the controller 212 may cause the delay element 202 to increment the delay value or phase shift value when the output of the sampler 204 is low, and the controller 212 may cause the delay element to decrement the delay value of the phase shift value when the output of the sampler 204 is high.

In alternate embodiments in which the delay element 202 is configured to delay or phase shift the loopback signal 105 instead of the transmit signal 103, the sampler 204 may be arranged to provide either a low or high output based on the state of the transmit signal 103 while the loopback signal is changing states (either rising or falling).

In some embodiments, signals derived from the transmit signal 103 and the loopback signal 105 may be used by the sampler 204 instead of the actual transmit signal 103 and loopback signal 105. These derived signals may be generated, for example, by a phase-locked loop (PLL) or an inverter.

In some embodiments, the high-resolution link-path delay estimator 200 may include processing circuitry 220. The processing circuitry 220 may be arranged to add the fine-delay estimate to the coarse delay estimate 219 to determine the round-trip signal delay 221 to within a fraction of the symbol period 111. Since the fine-time output 215 generated by the controller 212 may represent an amount of phase shift or delay introduced to align the delayed transmit signal 103, the processing circuitry 220 may convert the fine-time output 215 to a time estimate having the same units as the coarse-delay estimate 219 before such addition.

In alternate embodiments in which the loopback signal 105 is delayed instead of the transmit signal 103, the fine-delay estimate may be subtracted from the coarse delay estimate 219 to determine the round-trip delay 221 of the signal path 107 to within a fraction of the symbol period 111.

In some embodiments, if the coarse delay estimate 219 is an even number of symbol periods 111 and the fine-delay estimate is less than one symbol period 111 (one half of a clock period), the fine delay estimate may be added to the coarse delay estimate 219. If the coarse delay estimate 219 is an even number of symbol periods 111 and the fine-delay estimate is more than one symbol period 111, the fine delay estimate may be added to the coarse delay estimate 219 and the time corresponding to two symbol periods 111 may be subtracted. If the coarse delay estimate 219 is an odd number of symbol periods 111, the fine delay estimate may be added to the coarse delay estimate 219 and the time corresponding to one symbol period 111 may be subtracted. In alternate embodiments in which the loopback signal 105 is delayed instead of the transmit signal 103, the addition and subtraction operations may be reversed.

In some embodiments, the processing circuitry 220 may further be configured to compensate for any logic and propagation delay experienced within the elements of the high-resolution link-path delay estimator 200 to generate the round-trip delay 221. In some embodiments that use a plurality of remote devices for signal-source location or geo-location, only the relative loop delays may need to be determined. These embodiments are discussed in more detail below.

In some embodiments, the coarse delay estimator 218 may implement a conventional technique to determine the coarse delay estimate 219. Conventional techniques for determining a coarse delay estimate, for example, may be found in U.S. Pat. No. 7,359,408, U.S. Pat. No. 6,920,155 and U.S. Pat. No. 6,545,979.

In some embodiments that implement noise reduction, the high-resolution link-path delay estimator 200 may include a noise-reduction element 208. The noise-reduction element 208 may be arranged to use multiple sampled signal outputs 205 taken at a common one of the delay or phase shift values from the sampler 204 to produce the noise-reduced output 209 for use by the correlation element 210. In these embodiments, the use of the noise-reduction element 208 may cause a higher correlation in the correlation element 210 at the transition (e.g., from low to high or from high to low). In some embodiments, the noise-reduction element 208 may be arranged to sum or average the multiple sampled signal outputs 205 taken at the same delay or phase shift value to produce the noise-reduced output 209 for use by the correlation element 210.

Figure 3:
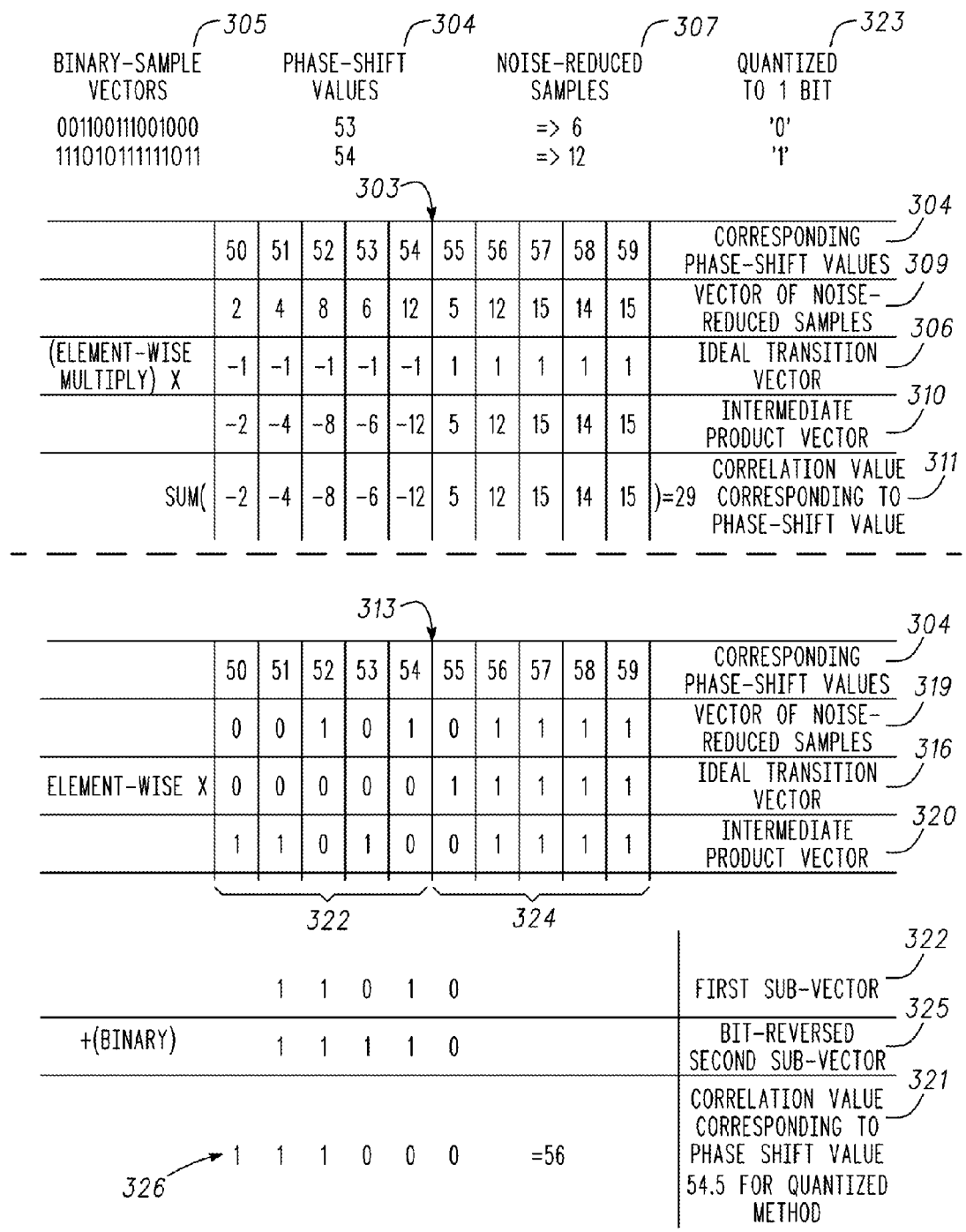
FIG. 3 illustrates noise reduction operations in accordance with some embodiments.

FIG. 3 illustrates noise reduction operations in accordance with some embodiments. As discussed above, the noise-reduction element 208 (FIG. 2) may be arranged to use multiple sampled signal outputs 205 (FIG. 2) taken at the same delay value or phase-shift value from the sampler 204 (FIG. 2) to produce the noise-reduced output 209 (FIG. 2) for use by the correlation element 210 (FIG. 2).

In some embodiments, the noise-reduction element 208 may receive a plurality of the sampled signal outputs 205 from the sampler. Each sampled signal output 205 may comprise a binary-sample vector 305 of one-bit samples taken at a common phase shift value by the sampler 204. The noise-reduction element 208 may produce a noise-reduced sample 307 from the elements of each binary-sample vector 305 (e.g., by either averaging or summing the elements of each binary-sample vector 305). Each noise-reduced sample 307 may have a corresponding phase shift value 304. In these embodiments, the noise-reduction element 208 may order the noise-reduced samples 307 based on their corresponding phase shift values 304 to provide a vector of noise reduced samples 309 for use by the correlation element 210.

In these embodiments, the correlation element 210 may be arranged to element-wise multiply, then sum (e.g., correlate) the vector of noise-reduced samples 309 with an ideal-transition vector 306 to generate a correlation value 311 corresponding to a phase shift of the noise-reduced sample nearest a transition 303 of the ideal-transition vector 306. The correlation value 311 may be provided to the controller 212 (FIG. 2).

In some embodiments, the ideal-transition vector 306 may represent an ideal transition from either high-to-low or low-to-high. In some embodiments, a single one-bit sample instead of a plurality of sampled signal outputs 205 may be used instead of when noise reduction is not being implemented.

In some embodiments, when the transition occurs in the center of the ideal-transition vector 306 and the number of elements in the vector of noise-reduced samples 309 is odd, the correlation value 311 corresponds to the phase shift of the noise-reduced sample in the center of the vector of noise-reduced samples 309. When the number of elements in the vector of noise-reduced samples 309 is even (as illustrated in FIG. 3), the correlation value 311 corresponds to the average phase shift of the two noise-reduced samples at the center of the vector of noise-reduced samples 309. In the example illustrated in FIG. 3, the average phase shift of the two noise-reduced samples at the center of the vector of noise-reduced samples 309 would be 54.5.

In some noise-reduction embodiments, a one-bit quantization may be performed. In these embodiments, the noise-reduction element 208 may be arranged to quantize each the binary-sample vector 305 to one bit 323 based on either an average of sum of the one-bit samples of the binary-sample vector 305 to produce a vector of quantized noise-reduced samples 319 for use by the correlation element 210. In these embodiments, the resulting quantized value 323 of the noise-reduced sample 307 may be one if the binary-sample vector 305 contains more ones than zeros, otherwise the resulting quantized value 323 of the noise-reduced sample 307 may be zero.

In these embodiments that perform one-bit quantization, the correlation element 210 may be arranged to perform an element-wise multiplication of the vector of quantized noise-reduced samples 319 with an ideal-transition vector 316 to generate an intermediate product vector 320. The intermediate product vector may comprise a first sub-vector 322 and a second sub-vector 324. The correlation element 210 may perform a bit reversal on the second sub-vector 324 to generate a bit-reversed second sub-vector 325, and may add, by binary addition, the first sub-vector 322 to the bit-reversed second sub-vector 325 to produce a correlation value 321. The correlation value 321 may be provided to the controller 212 (FIG. 2).

In some embodiments that perform one-bit quantization, as the ideal transition vector 306 may also be quantized to one bit (e.g., zero for negative values, one for positive values). The bits of the intermediate product vector 320 resulting from the element-wise multiplication may be ones when corresponding bits in the vector of noise-reduced samples and the ideal-transition vector 316 are the same, and may be zeros when corresponding bits in the vector of noise-reduced samples and the ideal-transition vector 306 are different. In some alternate embodiments, an exclusive-or (XOR) operation may be used to generate the resulting intermediate product vector 320.

In some embodiments, the element-wise multiplication may comprise a weighted multiplication using multiplicative weights based on a vector element position relative to the transition 313 in the ideal-transition vector 316. In some embodiments, the multiplicative weights may be a function of $2^n$, where n is the number of elements between a current element of the quantized noise-reduced samples 319 and the transition 313 of the ideal-transition vector 316. With this set of weights, the correlation element 210 may only need to perform only a single addition operation for each correlation value. After the element-wise multiplication with the ideal-transition vector 316, the first sub-vector 322 and the second sub-vector 324 of the intermediate product vector 320 (delimited by the index of the transition of the ideal-transition vector) may be treated as unsigned integers and summed after a bit reversal of the second sub-vector 324 (e.g., the right-hand sub-vector).

Although the high-resolution link-path delay estimator 200 (FIG. 2) is illustrated as having several separate functional elements, one or more of the functional elements may be combined and may be implemented by combinations of software-configured elements, such as processing elements including digital signal processors (DSPs), and/or other hardware elements. For example, some elements may comprise one or more microprocessors, DSPs, field-programmable gate arrays (FPGAs), application specific integrated circuits (ASICs), radio-frequency integrated circuits (RFICs) and combinations of various hardware and logic circuitry for performing at least the functions described herein. In some embodiments, the functional elements of the high-resolution link-path delay estimator 200 may refer to one or more processes operating on one or more processing elements.

Embodiments may be implemented in one or a combination of hardware, firmware and software. Embodiments may also be implemented as instructions stored on a computer-readable storage device, which may be read and executed by at least one processor to perform the operations described herein. A computer-readable storage device may include any non-transitory mechanism for storing information in a form readable by a machine (e.g., a computer). For example, a computer-readable storage device may include read-only memory (ROM), random-access memory (RAM), magnetic disk storage media, optical storage media, flash-memory devices, and other storage devices and media. In some embodiments, system 100 may include one or more processors and may be configured with instructions stored on a computer-readable storage device.

Figure 4:
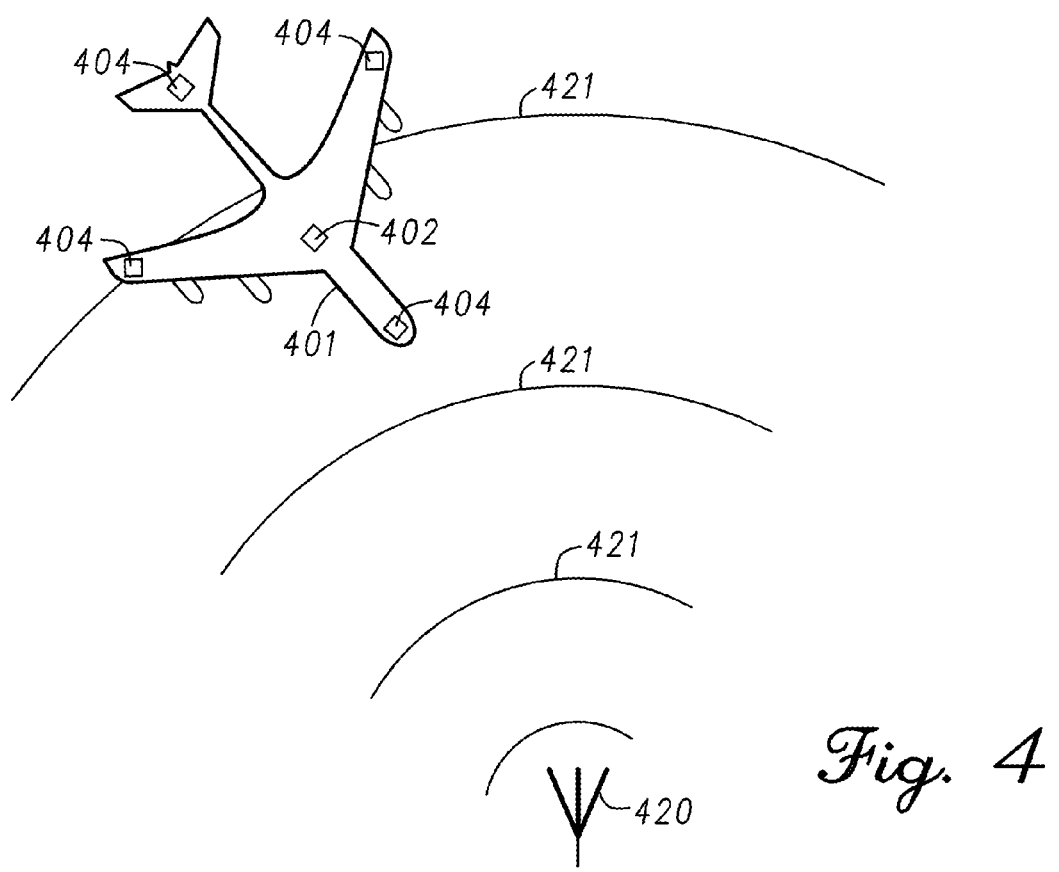
FIG. 4 illustrates the operation a signal-source locating system in accordance with some embodiments.

FIG. 4 illustrates the operation a signal-source locating system in accordance with some embodiments. Signal-source locating system may comprise a master device 402 and a plurality of spatially-distributed remote devices 404, each coupled to the master device 402 by a two-way signal path. The spatially-distributed remote devices 404 may be remote sensor devices. The signal-source locating system may be configured determine a direction to a signal source 420 or locate the signal source 420 based on signals 421 emanating from the signal source 420.

The master device 402 may include a high-resolution link-path delay estimator, such as high-resolution link-path delay estimator 120 (FIG. 1), which may be arranged to estimate the relative signal-path delay between the master device 102 and each of the spatially-distributed remote devices 404.

In some embodiments, each of the spatially-distributed remote devices 404 may be arranged to detect and record time-of-arrivals (TOAs) of the signals and the master device 402 may compare the TOAs from the spatially-distributed sensors 404 to estimate a direction or geo-location of a signal source 420. The TOAs may be compensated based on the relative signal-path delays.

In some embodiments, the signal-source locating system may be part of a radar-warning receiver (RWR) system for use on an aircraft 401. In these embodiments, each of the spatially-distributed remote devices 404 may comprise a radar-warning receiver (RWR) arranged to detect and record time-of-arrivals of radar pulses 421. The master device 402 may compare the TOAs from the RWRs to estimate a direction (e.g., angle of incidence) or geo-location of a radar signal source 420.

The TOAs that are provided by the spatially-distributed remote devices 404 to the master device 402 may differ due to differences in the signal paths between the master device and each remote device 404 (e.g., approximate 3.3 ns per meter for signals traveling at the speed of light). In these embodiments, the master device 402 may compensate the TOAs based on the estimate of the signal-path delay determined by the high-resolution link-path delay estimator to correctly determine the times at which observations are made to precisely estimate the direction of the source 420.

In some embodiments, clock-phase separation of spatially-distributed subsystems may be determined. In these embodiments, spatially-distributed remote devices 404 and the master device 402 may utilize synchronous clocks for communication of the TOA estimates. The use of the high-resolution link-path delay estimator 200 (FIG. 2) may help reduce temporal unknown in data fusion from the remote devices 404, compensate for signal skew over the links and may allow the clock-phase separation to be determined for the spatially-distributed remote devices 404. For example, the master device 402 and the remote devices 404 may have a common clock source located at the master device 402. A counter in each remote device 404 may be reset by a pulse sent to each remote device 402 by the master device 102. If each remote device 404 were to report a concurrent event with a timestamp with the counter value at the time of occurrence, a discrepancy between the reports' timestamps would be observed due to the difference in delay of the reset pulse over each link and the difference in delay of the clock between the master device 402 and each remote device 404. The high-resolution link-path delay estimate may be used to compensate for this difference to determine the actual time of occurrence relative to the master clock or the clock of one remote device relative to another.

Figure 5:
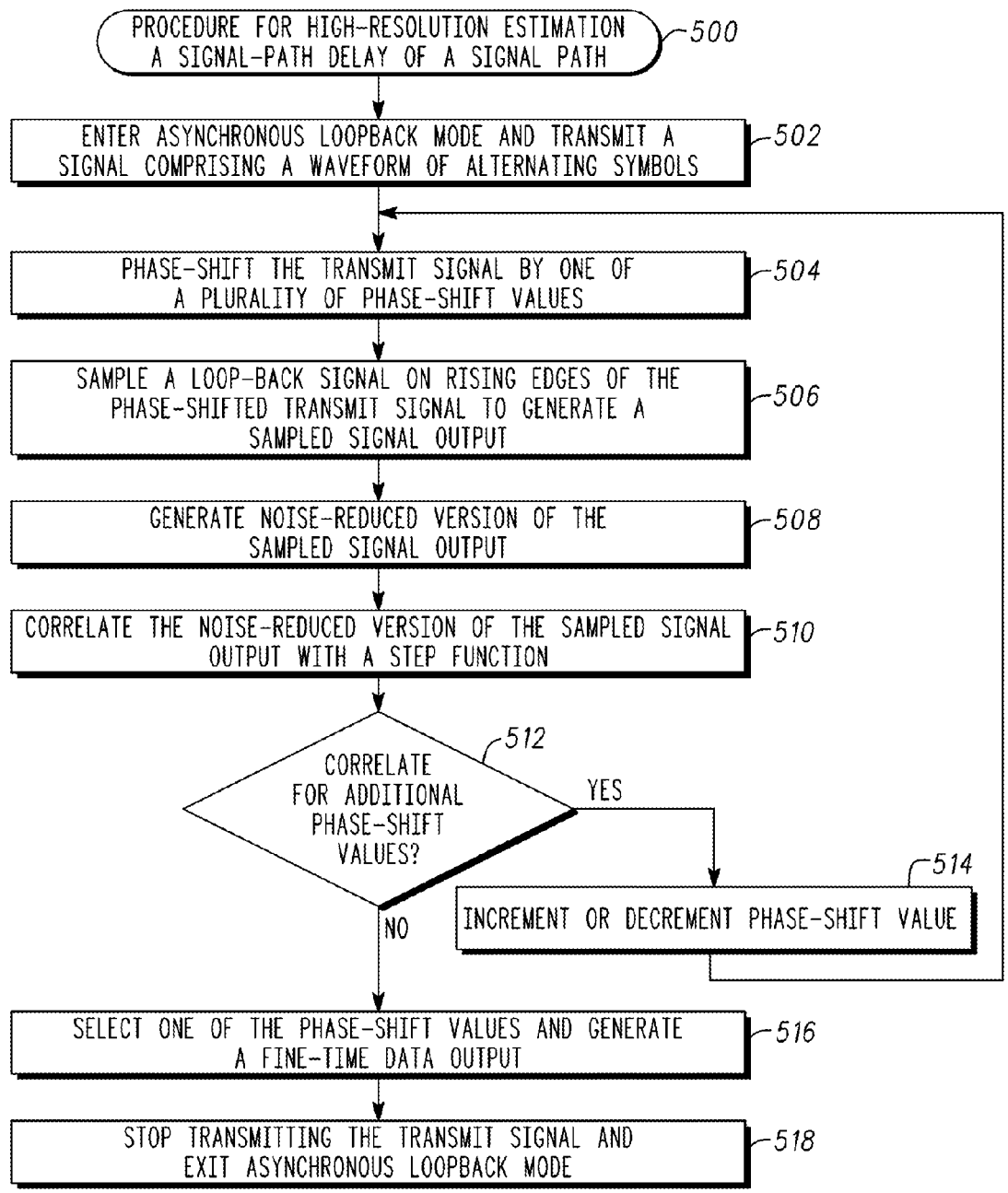
FIG. 5 is a procedure for high-resolution estimation of a signal-path delay in accordance with some embodiments.

FIG. 5 is a procedure for high-resolution estimation of a signal-path delay in accordance with some embodiments. Procedure 500 may be performed by a high-resolution link-path delay estimator, such as high-resolution link-path delay estimator 120 (FIG. 1), although other high-resolution link-path delay estimator configurations may also be used. Procedure 500 may be performed to estimate a signal-path delay of a signal path between a master device and a remote device.

In operation 502, the master device and the remote device may enter asynchronous loopback mode. During asynchronous loopback mode, the remote device may be configured to refrain from clocking or re-clocking signals received from the master device and may be configured to receive a transmit signal over the transmit signal path from the master device and return the transmit signal via return path without clocking or re-clocking the transmit signal.

Operation 504 comprises phase-shifting the transmit signal by one of a plurality of phase-shift values.

Operation 506 comprises sampling the returned signal (e.g., the loopback signal) to generate a sampled signal output 205.

Operation 508 comprises generating a noise-reduced version of the sampled signal output.

Operation 510 comprises correlating the noise-reduced version of the sampled signal output with a step function to generate a correlation value for a current phase-shift value.

Operation 512 determines if additional correlations are to be performed for additional phase-shift values. When additional correlations are to be performed for additional phase-shift values, operation 514 is performed. When additional correlations are not to be performed for additional phase-shift values, operation 516 is performed.

In operation 514, another phase shift value is selected and operations 504 through 512 are performed for the newly selected phase shift value. In some embodiments, the current phase-shift value is either incremented or decremented depending on whether the sampled signal output is high or low.

Operation 516 comprises selecting one of the phase-shift values based on the associated correlation value to generate a fine-delay estimate. The fine-delay estimate may be an estimate of the signal-path delay to within a fraction of the symbol period of the transmit signal. The fine-delay estimate may be added to a coarse delay estimate to determine the signal-path delay of the signal path between the master device and a remote device.

In operation 518, the master device may refrain from transmitting the transmit signal and the master and the remote device may exit asynchronous loop back mode. After operation 518, the master and the remote device may return to data-transfer mode.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A high-resolution link-path delay estimator to estimate a signal-path delay of a signal path between a master device and a remote device, the high-resolution link-path delay estimator comprising:

a delay element to delay a transmit signal by one of a plurality of delay values, the transmit signal comprising a waveform of alternating symbols such that each successive symbol alternates between high and low, each symbol having a symbol period;

receive a loopback signal from the remote device;

a sampler to sample the loopback signal on one of either rising or falling edges of the delayed transmit signal to generate a sampled signal output, the loopback signal being a delayed version of the transmit signal that is returned from the remote device;

a noise-reduction element arranged to generate a noise-reduced output from the sampled signal output;

a correlation element to correlate the noise-reduced output with a step function to generate a correlation value for each of the delay values; and a controller to instruct the delay element to delay the transmit signal by a selected one of the delay values and generate a fine-time data output based on the correlation value, the fine-time data output being an indicator of the signal-path delay to within a fraction of the symbol period.

2. The high-resolution link-path delay estimator of claim 1 wherein the delay element comprises a phase-shifter to phase shift the transmit signal by one of a plurality of phase-shift values, and wherein the controller is configurable to cause the phase-shifter to shift through at least some of the phase-shift values and select one of the phase-shift values that provides either a maximum correlation value or a correlation value above a threshold to generate the fine-time data output corresponding to the selected phase-shift value.

3. The high-resolution link-path delay estimator of claim 2 wherein each of the phase-shift values are a fraction of the symbol period of the transmit signal, the plurality of phase-shift values together comprise up to one symbol period of the transmit signal.

4. The high-resolution link-path delay estimator of claim 3 wherein the sampled signal output indicates whether an error of a coarse delay estimate of the signal path is positive or negative, the coarse delay estimate being an estimate of the signal-path delay of the signal path with an accuracy to a nearest symbol period of the transmit signal.

5. The high-resolution link-path delay estimator of claim 4 wherein the sampler is arranged to provide a low output when the loopback signal is low while the delayed transmit signal is rising, and wherein the sampler is arranged to provide a high output when the loopback signal is high while the delayed transmit signal is rising.

6. The high-resolution link-path delay estimator of claim 4 wherein the signal path includes a transmit signal path, a receive signal path and a loopback signal path, the loopback signal path being within the remote device, wherein a round-trip signal delay between the master device and the remote device includes signal delays of the transmit signal path, the receive signal path and the loopback signal path.

7. The high-resolution link-path delay estimator of claim 6 wherein the estimate of the signal-path delay of the signal path to within the fraction of the symbol period is a fine-delay estimate, and wherein the high-resolution link-path delay estimator includes processing circuitry arranged to add the fine-delay estimate to the coarse delay estimate to determine the round-trip signal delay to within a fraction of the symbol period.

8. The high-resolution link-path delay estimator of claim 7 wherein the master device and remote device are configurable to operate in one of either an asynchronous loopback mode or a data-transfer mode, wherein during the asynchronous loopback mode, the remote device is to refrain from clocking or re-clocking signals received from the master device and is configured to receive the transmit signal from the master device and the remote device is to return the transmit signal without clocking or re-clocking the transmit signal, and wherein during the data transfer mode, the remote device is configured to communicate data with the master device.

9. The high-resolution link-path delay estimator of claim 2 wherein the noise-reduction element is arranged to use multiple sampled signal outputs taken at a common one of the phase shift values from the sampler to produce the noise-reduced output for use by the correlation element.

10. The high-resolution link-path delay estimator of claim 9 wherein the noise-reduction element arranged to:

receive a plurality of the sampled signal outputs from the sampler, each sampled signal output comprising a binary-sample vector of one-bit samples taken at a common phase shift value by the sampler;

produce a noise-reduced sample from the elements of each binary-sample vector, each noise-reduced sample having a corresponding phase shift value, order the noise-reduced samples based on their corresponding phase shift values to provide a vector of noise reduced samples for use by the correlation element, and wherein the correlation element is arranged to:

element-wise multiply and sum the vector of noise-reduced samples with an ideal-transition vector to generate a correlation value corresponding to a phase shift of the noise-reduced sample nearest a transition of the ideal-transition vector 306.

11. The high-resolution link-path delay estimator of claim 9 wherein the noise-reduction element arranged to:

receive a plurality of sampled signal outputs from the sampler, each sampled signal output comprising a binary-sample vector of one-bit samples taken at a common phase shift value by the sampler; and quantize each the binary-sample vector to one bit to produce a vector of quantized noise-reduced samples for use by the correlation element.

12. The high-resolution link-path delay estimator of claim 11 wherein the element-wise multiplication comprise a weighted multiplication using multiplicative weights based on a vector element position relative to the transition in the ideal-transition vector.

13. A method for estimating signal-path delay of a signal path between a master device and a remote device, the method comprising:

phase-shifting a transmit signal by one of a plurality of phase-shift values, the transmit signal comprising a waveform of alternating symbols such that each successive symbol alternates between high and low, each symbol having a symbol period;

receiving a loopback signal from the remote device;

sampling the loopback signal on one of either rising or falling edges of the phase-shifted transmit signal to generate a sampled signal output, the loopback signal being a delayed version of the transmit signal returned from the remote device;

generating a noise-reduced output from the sampled signal output; and generating a fine-delay estimate based on the noise-reduced output resulting from a selected one of the phase-shift values for use in determining the signal path delay.

14. The method of claim 13 further comprising correlating the noise-reduced output with a step function to generate a correlation value for each of the phase-shift values, wherein the fine-time data output is generated based on the correlation value, the fine-time data output being an indicator of the signal-path delay to within a fraction of the symbol period.

15. The method of claim 14 further comprising:
stepping through at least some of the phase-shift values of the plurality to select one of the phase-shift values based on the correlation values to generate the fine-delay estimate; and
adding the fine-delay estimate to a coarse delay estimate to determine the signal-path delay,
wherein the coarse delay estimate is an estimate of the signal-path delay to a nearest symbol period.

16. The method of claim 15 further comprising performing noise reduction by using multiple sampled signal outputs taken at a common one of the phase shift values to produce the noise-reduced output for use in correlating.

17. The method of claim 16 wherein the master device and remote device are configurable to operate in one of either an asynchronous loopback mode or a data-transfer mode,
wherein during the asynchronous loopback mode, the remote device is to refrain from clocking or re-clocking signals received from the master device and is configured to receive the transmit signal from the master device and return the transmit signal without clocking or re-clocking the transmit signal, and
wherein during the data transfer mode, the remote device is configured to communicate data with the master device.

18. A signal-source locating system comprising:
a master device;
a plurality of spatially-distributed remote devices, each coupled to the master device by a two-way signal path,
wherein the master device includes a high-resolution link-path delay estimator arranged to:
delay the transmit signal by one of a plurality of delay values, the transmit signal comprising a waveform of alternating symbols such that each successive symbol alternates between high and low, each symbol having a symbol period;
receive a loopback signal from the remote device;
sample the loopback signal on rising edges of the delayed transmit signal to generate a sampled signal output, the loopback signal being a delayed version of the transmit signal that is returned from the remote device;
generate a noise-reduced output from the sampled signal output;
correlate the noise-reduced output with a step function to generate a correlation value for each of the delay values; and
cause the transmit signal to be delayed by a selected one of the delay values and generate a fine-time data output based on the correlation value, the fine-time data output being an indicator of the signal-path delay to within the fraction of a symbol period of the transmit signal,
wherein the high-resolution link-path delay estimator that is arranged to estimate a relative signal-path delay between the master device and each of the spatially-distributed remote devices to within a fraction of the symbol period.

19. The signal-source locating system of claim 18 wherein the high-resolution link-path delay estimator is further arranged to add the fine-delay estimate to a coarse delay estimate to determine the signal-path delay,
wherein the coarse delay estimate is an estimate of the signal-path delay to a nearest symbol period.

20. The signal-source locating system of claim 19 wherein the sampled signal output indicates whether an error of the coarse delay estimate of the signal path is positive or negative.

21. The signal-source locating system of claim 20, wherein the system is part of a radar-warning receiver (RWR) system for use on an aircraft,
wherein each of the spatially-distributed remote devices comprise a radar-warning receiver (RWR) arranged to detect and record time-of-arrivals (ToAs) of radar pulses,
wherein the master device is arranged to compare the ToAs from the RWRs to estimate a direction or geo-location of a signal source transmitting the radar pulses.

* * * * *